United States Patent [19]
Lee et al.

[11] Patent Number: 6,133,103
[45] Date of Patent: Oct. 17, 2000

[54] METHOD FOR FABRICATING MASK ROM

[75] Inventors: He-jueng Lee, Cheonan; Ki-chang Yoon, Suwon, both of Rep. of Korea

[73] Assignee: Samsung Electronics, Co., Ltd., Suwon, Rep. of Korea

[21] Appl. No.: 09/357,674

[22] Filed: Jul. 20, 1999

[30] Foreign Application Priority Data

Jul. 20, 1998 [KR] Rep. of Korea ................ 98-29139

[51] Int. Cl.[7] .................................. H01L 21/8236
[52] U.S. Cl. ................. 438/276; 438/278; 438/275; 438/636
[58] Field of Search ................... 438/275, 276, 438/277, 278, 279, 636

[56] References Cited

U.S. PATENT DOCUMENTS

| | | | |
|---|---|---|---|
| 5,308,777 | 5/1994 | Hong | 438/278 |
| 5,380,676 | 1/1995 | Hsue et al. | 438/276 |
| 5,429,975 | 7/1995 | Sheu et al. | 438/278 |

*Primary Examiner*—Charles Bowers
*Assistant Examiner*—Hsien-Ming Lee
*Attorney, Agent, or Firm*—Marger Johnson & McCollom, P.C.

[57] ABSTRACT

A method for fabricating a mask read only memory (ROM) is provided. A plurality of word lines functioning as a gate electrode of a cell transistor and a plurality of first anti-reflective layer patterns are sequentially formed on a semiconductor substrate. An insulator layer is formed over the entire surface of the semiconductor substrate where the plurality of first anti-reflective layer patterns and the plurality of word lines are formed. A spacer is formed at the side walls of the respective word lines by anisotropically etching the insulator layer until the plurality of word lines are exposed. A second anti-reflective layer is formed over the entire surface of the semiconductor substrate where the spacer is formed. A photoresist pattern opening the upper portion of a predetermined region of at least one word line selected among the plurality of word lines of the cell transistor to be programmed is formed on the second anti-reflective layer. An impurity is implanted into a channel region of the opened cell transistor using the photoresist pattern as an ion implantation mask.

8 Claims, 8 Drawing Sheets

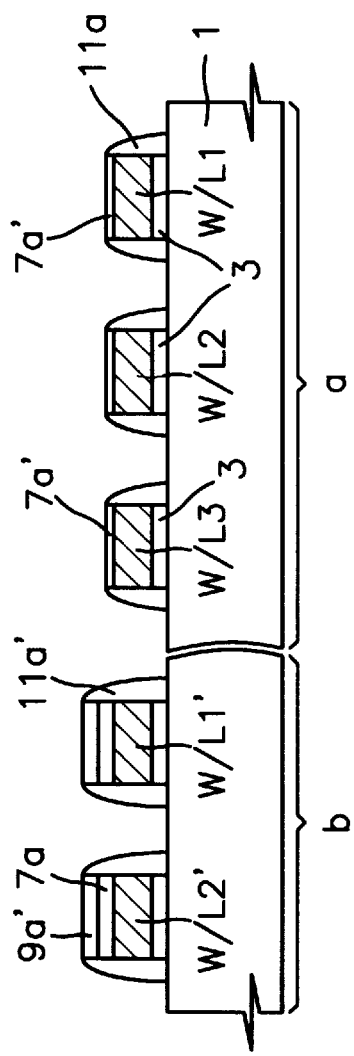
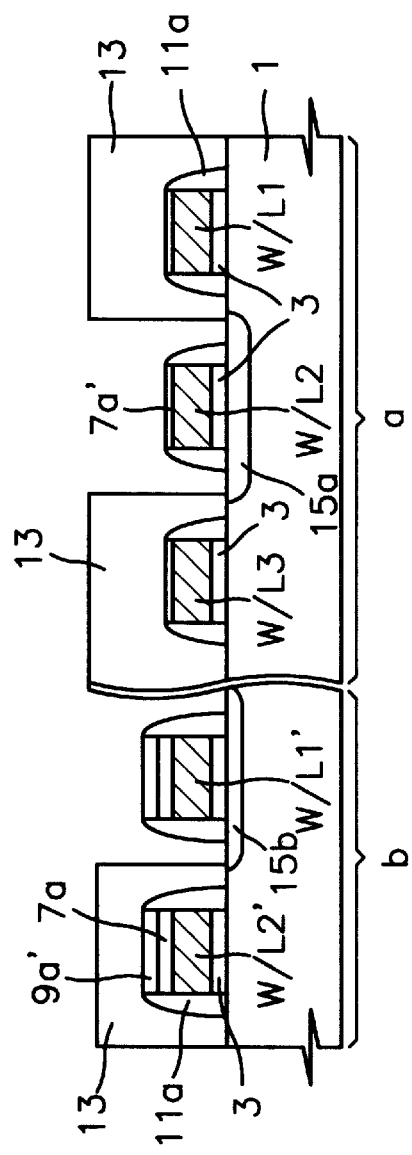

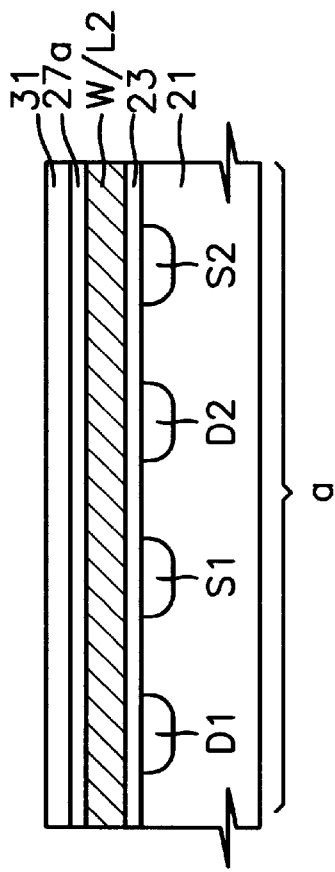
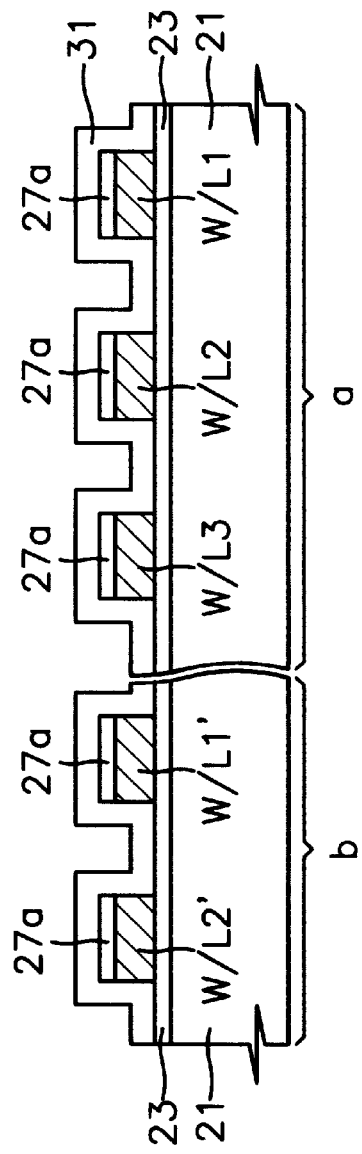

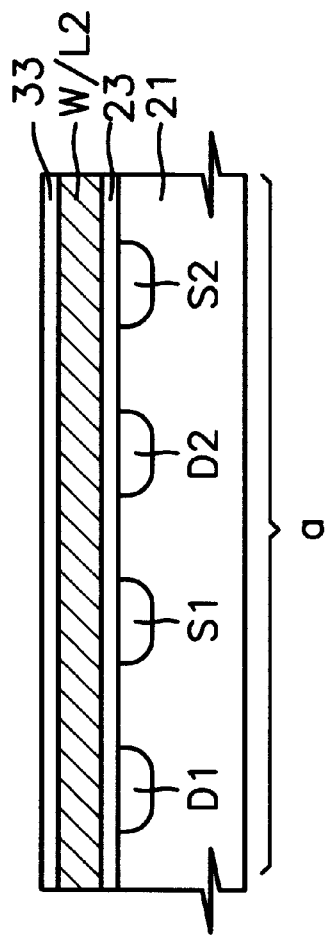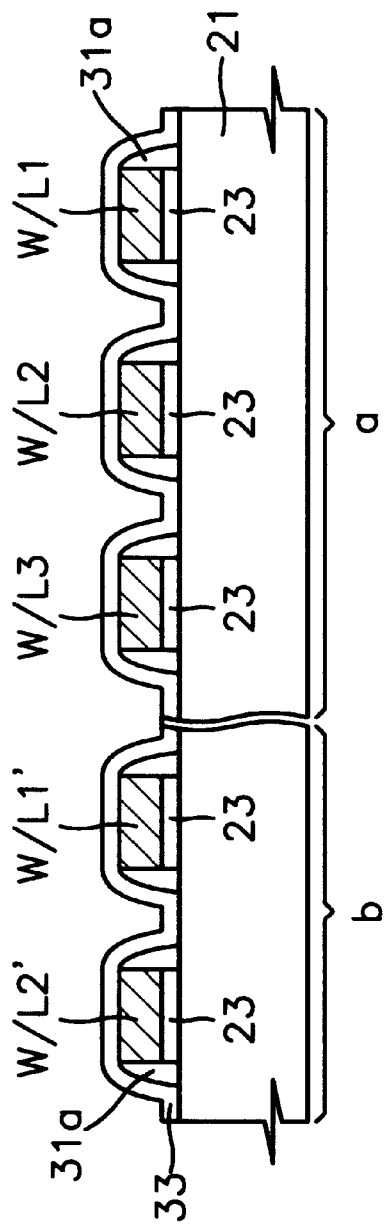

W/Ln are arranged across the pair of the drains
METHOD FOR FABRICATING MASK ROM

BACKGROUND OF THE INVENTION

1. Field of the Invention

The present invention relates to a method for fabricating a semiconductor device and, more particularly, to a method for fabricating a mask read only memory (ROM).

2. Description of the Related Art

A mask ROM is a device for programming a desired cell transistor by selectively implanting impurity ions into a channel region of the cell transistor in the course of fabricating the same. Once information is programmed, the information cannot be erased. It is difficult to attain a high density of integration in a NOR-type mask ROM relative to a NAND-type mask ROM. Accordingly, to increase the integration density of the NOR-type mask ROM, a multi-bit cell mask ROM has been developed. The multi-bit cell mask ROM reads out information stored in the respective cell transistors by successively applying a multitude of different voltages, e.g., three different voltages, to a word line functioning as a gate electrode of a cell transistor. For example, the information of a selected cell transistor is read out by successively applying a first voltage, a second voltage higher than the first voltage, and a third voltage higher than the second voltage to a word line connected to the selected cell transistor having a predetermined threshold voltage. Here, if the predetermined threshold voltage is lower than the first voltage, the multi-bit cell mask ROM outputs a signal having 2-bit information "00". If the predetermined threshold voltage is higher than the first voltage and lower than the second voltage, the multi-bit cell mask ROM outputs a signal having 2-bit information "01". If the predetermined threshold voltage is higher than the second voltage and lower than the third voltage, the multi-bit cell mask ROM outputs a signal having 2-bit information "10". If the predetermined threshold voltage is higher than the third voltage, the multi-bit cell mask ROM outputs a signal having 2-bit information "11".

As described above, in a multi-bit cell mask ROM a cell transistor must be programmed so as to have a threshold voltage belonging to one of four voltage ranges. The voltage ranges are divided into first through fourth voltage ranges. Accordingly, the multi-bit cell mask ROM must adjust the threshold voltage of a cell transistor more accurately and uniformly than a conventional mask ROM. As a result, a high level of uniformity is required during impurity ion implantation process.

FIG. 1 is an equivalent circuit diagram of a pair of strings sharing a bit line in a cell array portion of a general NOR-type mask ROM. FIG. 2 is a plan view illustrating cell array portions spaced a predetermined distance apart from each other on which a pair of strings are two-dimensionally arranged, according to the equivalent circuit diagram of FIG. 1.

Referring to FIGS. 1 and 2, a bit line B/L is connected to a string select controller SSC, which is connected to two drain lines D1 and D2. The SSC selects one of a pair of drain lines D1 and D2 responsive to a voltage applied to first and second string select lines SSL1 and SSL2. A plurality of cell transistors are connected in parallel to the first drain line D1, the plurality of cell transistors constituting a first string. The plurality of cell transistors share a first source line S1. Likewise, a plurality of cell transistors are connected in parallel to the second drain line D2, the plurality of cell transistors constituting a second string. The plurality of cell transistors share a second source line S2. The pair of the drains lines D1 and D2 and the pair of the source lines S1 and S2 are arranged on the surface of a semiconductor substrate parallel to each other. The drain lines D1 and D2 and the source lines S1 and S2 are impurity layers doped with impurities of a conductivity type different from that of the semiconductor substrate. A plurality of word lines W/L1, . . . W/Ln are arranged across the pair of the drains lines D1 and D2 and the pair of the source lines S1 and S2. The distance d (FIG. 2) between the word lines becomes narrower with increased integration of a mask ROM. Generally, the distance (d) between the word lines has a value corresponding to a minimum design rule.

In FIG. 2, a portion showing the first through third word lines W/L1, W/L2 and W/L3 is a first region (a) representing a part of a pair of strings sharing one bit line. A portion showing another word lines W/L1' and W/L2' is a second region (b) representing a part of a pair of strings sharing another bit line (not shown). Thus, there are also provided a pair of drain lines D1' and D2' and a pair of source lines S1' and S2' in the second region (b). Also, patterns M1 and M2 indicated by a dotted line are patterns for an ion implantation mask for programming a desired cell transistor by selectively implanting impurity into a channel region of the cell transistor. Here, the ion implantation mask pattern M1 corresponds to a mask pattern for programming a cell transistor P shown in FIG. 1.

FIGS. 3 through 6 are cross-sectional views illustrating a method for fabricating a conventional NOR-type mask ROM, taken along the line BB, shown in FIG. 2. Here, portions indicated by reference symbols (a) and (b) correspond to the first and second regions shown in FIG. 2, respectively.

Referring to FIG. 3, a plurality of parallel drain lines (D1, D2, D1' and D2' of FIGS. 1 and 2) and a plurality of source lines (S1, S2, S1' and S2' of FIGS. 1 and 2) are formed on a predetermined area of a semiconductor substrate 1 by implanting an impurity having a conductivity type different from that of the semiconductor substrate 1. A gate oxide layer 3, a conductive layer 5, an anti-reflective layer 7, and a hard mask oxide layer 9 are formed over the entire surface of the semiconductor substrate 1 where the plurality of drain lines and the plurality of source lines are formed. The conductive layer 5 is formed of a tungsten polycide layer having a resistivity lower than the doped polysilicon layer, and the hard mask oxide layer 9 is formed of a Chemical Vapor Deposition (CVD) oxide layer. The anti-reflective layer 7 is formed of a silicon oxynitride layer.

Referring to FIG. 4, an oxide layer pattern 9a is formed by patterning the hard mask oxide layer 9 using a photolithography/etching process. The anti-reflective layer 7 and the conductive layer 5 are sequentially etched using the oxide layer pattern 9a as an etching mask thereby forming a plurality of word lines W/L1, W/L2, W/L3, W/L1' and W/L2' and an anti-reflective layer pattern 7a positioned thereon. Subsequently, an insulator layer 11, e.g., a CVD oxide layer having an excellent step coverage, is formed over the entire surface of the semiconductor substrate where the plurality of word lines are formed.

Referring to FIG. 5, the insulator layer 11 is anisotropically etched to form a spacer 11a at the side walls of the respective word lines W/L1, W/L2, W/L3, W/L1' and W/L2'. As shown in FIG. 5, the thickness of a material layer remaining on the word lines in the first region (a) is different from that of a material layer remaining on the word lines in the second region (b). In other words, whereas only a modified anti-reflective layer pattern 7a' remains on the word lines in the first region (a), a modified oxide layer pattern 9a' and the anti-reflective layer pattern 7a remain on the word lines in the second region (b). This is because all etching processes including one for forming the spacer 11a do not show uniform etching rates throughout the semiconductor substrate 1. Here, anisotropic overetching for forming the spacer 11a may be carried out to expose all the word lines. However, in such a case, etching damage applied to the surface of the semiconductor substrate 1 may be severe enough to cause a leakage current in a cell transistor. Thus, it is not easy to carry out anisotropic overetching.

Referring to FIG. 6, a photoresist layer is formed over the entire surface of the semiconductor substrate where the spacer 11a is formed. The photoresist layer is patterned using a photomask on which ion implantation mask patterns M1 and M2 shown in FIG. 2 are formed. Doing so forms a photoresist pattern 13 opening a cell transistor having a predetermined region of the first word line W/L1 in the first region (a) as a gate electrode and another cell transistor having a predetermined region of the word line W/L1' in the second region (b) as a gate electrode. Subsequently, an impurity is implanted into the channel region of the opened cell transistors using the photoresist pattern 13 as an ion implantation mask to form impurity layers 15a and 15b. At this time, the impurity layer 15a formed in the first region (a) and the impurity layer 15b formed in the second region (b) have different depth and concentration. This is because the thickness of a material layer remaining on the word lines in the first region (a) is different from that of a material layer remaining on the word lines in the second region (b), as shown in FIG. 5. As a result, threshold voltages of cell transistors programmed in one semiconductor substrate are different according to their positions.

Since threshold voltages of cell transistors programmed in one semiconductor substrate are different according to their positions, errors may be generated during a read operation. In particular, in a multi-bit cell mask ROM, the threshold voltage of a programmed cell transistor must be uniformly adjusted to prevent reading errors from being generated.

Accordingly, a need remains for a method for fabricating a mask ROM that prevents differences in the threshold voltages of programmed cell transistors.

SUMMARY OF THE INVENTION

It is an object of the present invention to overcome the problems associated with prior art methods for fabricating mask ROMs.

It is another object of the present invention to provide a method for fabricating a mask ROM that improves the level of uniformity of cell transistor threshold voltages.

Accordingly, a method for fabricating a mask read only memory is provided. The method comprises sequentially forming a gate insulation layer, a conductive layer and a first anti-reflective layer on a semiconductor substrate and forming a plurality of word lines and a plurality of first anti-reflective layer patterns by successively patterning the first anti-reflective layer and the conductive layer. The method further comprises forming an insulator layer over the entire surface of the semiconductor substrate, anisotropically etching the insulator layer until portions of the plurality of word lines are exposed thereby forming a spacer on side walls of respective word lines, and forming a second anti-reflective layer over the entire surface of the semiconductor substrate where the spacer is formed. A photoresist pattern is formed on the second anti-reflective layer that opens an upper portion of at least one word line. An impurity is implanted into the semiconductor substrate under the at least one word line using the photoresist pattern as an ion implantation mask.

According to the present invention, after forming the photoresist pattern opening the cell transistor intended to be programmed, only the second anti-reflective layer having a predetermined thickness exists on the word lines of the opened cell transistor. Thus, threshold voltages of the cell transistor programmed by an impurity ion implantation process are uniform irrespective of the cell transistor positions on the semiconductor substrate.

BRIEF DESCRIPTION OF THE DRAWINGS

The foregoing and other objects, features, and advantages of the present invention will become more readily apparent from the following detailed description of a preferred embodiment that proceeds with reference to the following drawings.

FIGS. 3 through 6 are cross-sectional views illustrating a. method for fabricating the conventional mask ROM, taken along the line BB' shown in FIG. 2;

FIGS. 7A through 10A are cross-sectional views illustrating a method for fabricating a mask ROM according to the present invention, taken along the line AA' shown in FIG. 2; and FIGS. 7B through 10B are cross-sectional views illustrating a method for fabricating a mask ROM according to the present invention, taken along the line BB' shown in FIG. 2.

DESCRIPTION OF THE PREFERRED EMBODIMENTS

Figure 1:
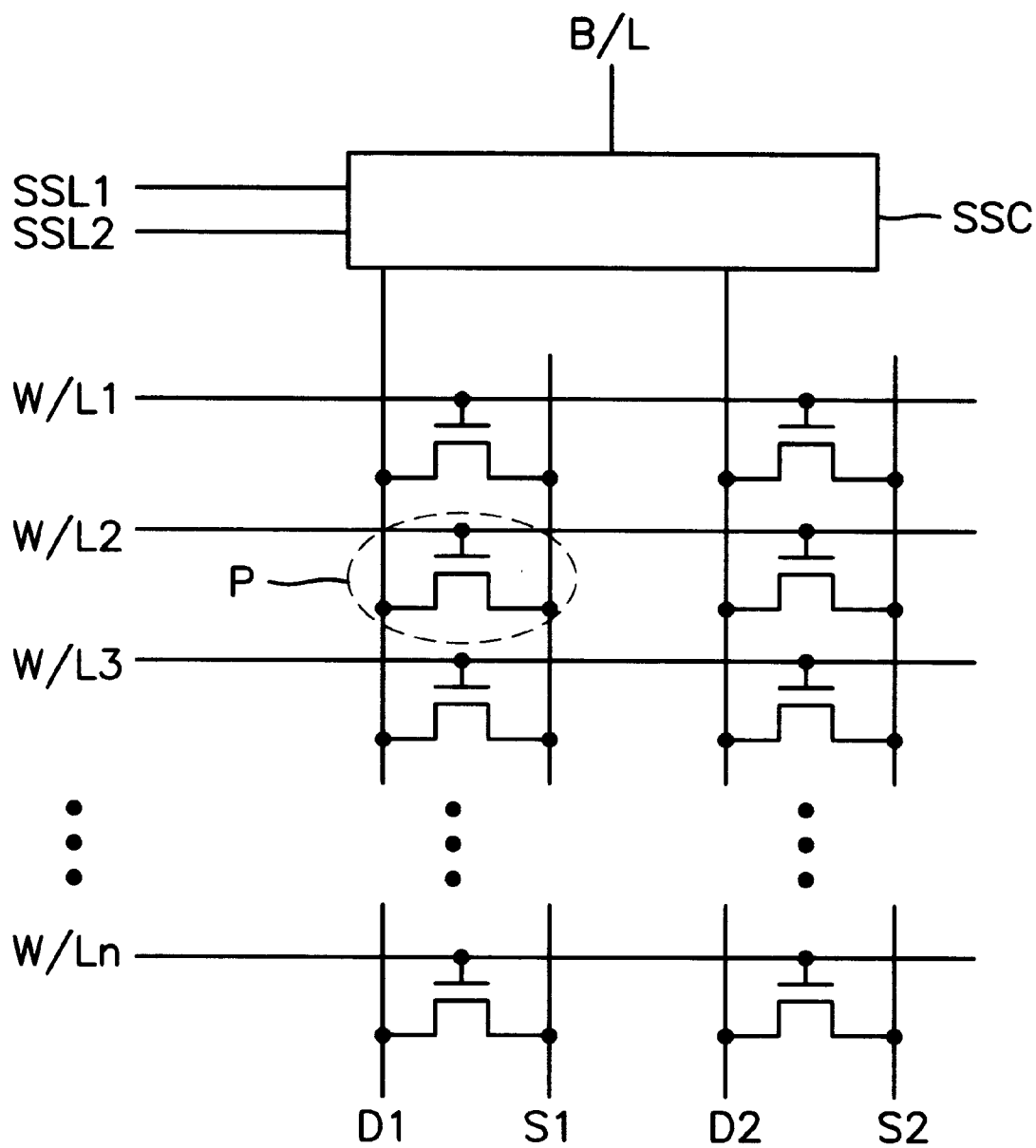
FIG. 1 is an equivalent circuit diagram of a pair of strings sharing a bit line in a cell array portion of a conventional NOR-type mask ROM.
Figure 2:
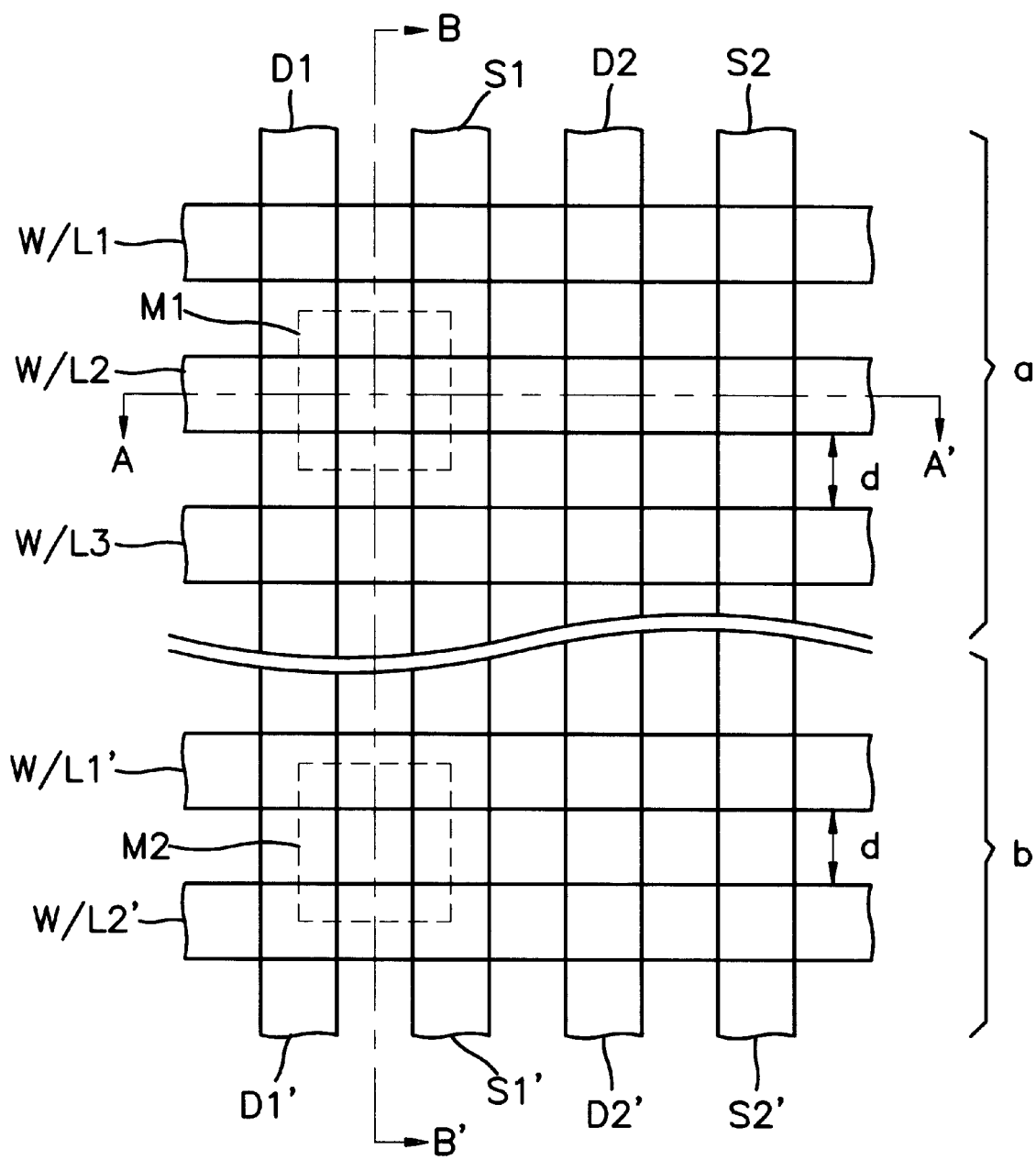
FIG. 2 is a plan view of the cell array portion shown in FIG. 1.
Figure 3:
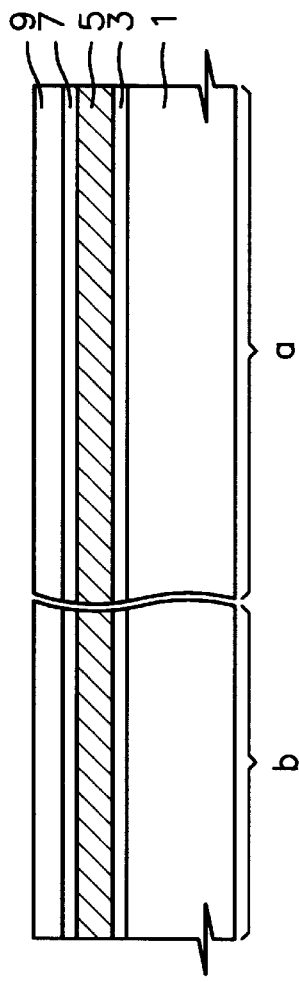
Figure 4:
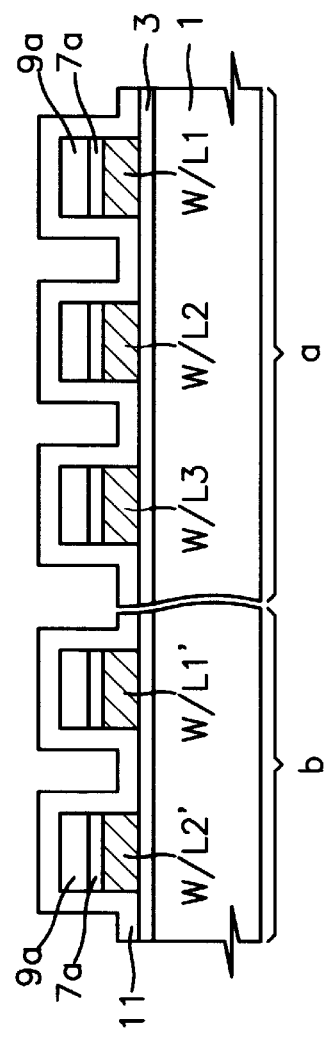

FIGS. 7A through 10A are cross-sectional views taken along the line AA' shown in FIG. 2 and FIGS. 7B through 10B are cross-sectional views taken along the line BB' shown in FIG. 2. Same reference numerals indicate the same parts in FIGS. 1–10B.

Figure 7A:
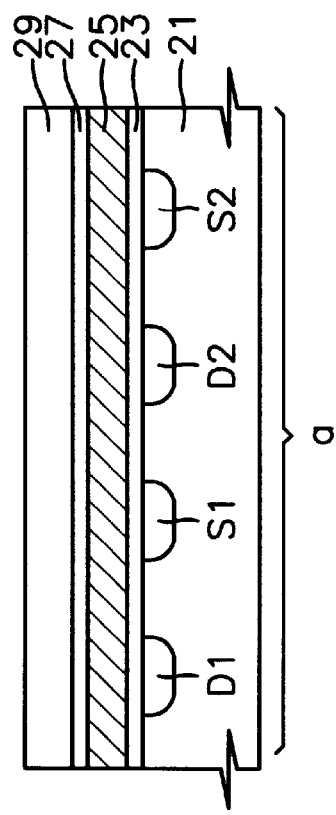
Figure 7B:
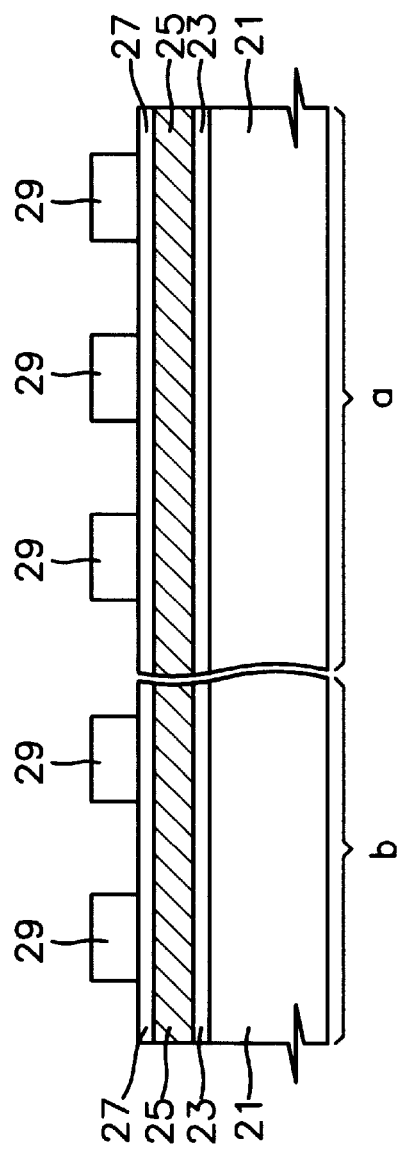

Referring to FIGS. 7A and 7B, a plurality of drain lines D1 and D2 are formed parallel to each other on a semiconductor substrate 21, e.g., a P-type silicon substrate. Similarly, a plurality of source lines S1 and S2 are formed on the substrate 21. A drain line and a source line serve as a common drain region and a common source region shared by a plurality of cell transistors constituting a string. Thus, as shown in FIG. 7A, the first drain line D1 and the first source line S1 are formed adjacent each other and the second drain line D2 and the second source line S2 are formed adjacent each other. Also, although not shown in FIGS. 7A and 7B, another plurality of drain lines D1' and D2' and another plurality of source lines S1' and S2' are formed in the second region (b) spaced apart from the first region (a) by a predetermined distance. The plurality of drain lines D1, D2, D1' and D2' and the plurality of source lines S1, S2, S1' and S2' formed in the first and second regions (a) and (b), are preferably formed by implanting an impurity of a conductivity type different from that of the semiconductor substrate 21, e.g., N-type impurity. The impurity is generally implanted into a predetermined area of the semiconductor substrate 21 at a dose of $1.0 \times 10^{15}$ ion atoms/cm$^2$ or higher. The plurality of drain lines D1, D2, D1' and D2' serve as sub bit lines. A gate insulation layer 23 is formed over the entire surface of the semiconductor substrate 21 where the plurality of drain lines and the plurality of source lines are formed. The gate insulation layer 23 is preferably formed of a thermal oxide layer. A conductive layer 25 and a first anti-reflective layer 27 are sequentially formed on the gate insulation layer 23. The conductive layer 25 is preferably formed of a polycide layer containing a material layer having a low resistivity, e.g., a refractory metal. As the polycide layer, a tungsten polycide layer or a titanium polycide layer is preferred. The first anti-reflective layer 27 is a material layer for minimizing irregular reflection of light during a photolithography process for patterning the conductive layer 25. Thus, the first anti-reflective layer 27 is formed of a material layer having a refractive index of 1.9 or greater and preferably formed of a silicon oxynitride layer. A photoresist layer is coated on the first anti-reflective layer 27 and then patterned by a photolithography process to thereby form a plurality of photoresist patterns 29 traversing the plurality of drain lines and the plurality of source lines.

Referring to FIGS. 8A and 8B, the first anti-reflective layer 27 and the conductive layer 25 are sequentially etched using the photoresist pattern 29 as an etching mask to thereby form a plurality of parallel word lines W/L1, W/L2, W/L3, W/L1' and W/L2',. A first anti-reflective layer pattern 27a exists on the respective word lines. A gate electrode (not shown) of a MOS transistor of a peripheral circuit is also formed. Subsequently, an insulator layer 31, e.g., a CVD oxide layer having an excellent step coverage, is formed over the entire surface of the semiconductor substrate 21 where the plurality of word lines W/L1 W/L2, W/L3, W/L' and W/L2' and the first anti-reflective layer pattern 27a are formed.

Referring to FIGS. 9A and 9B, the insulator layer 31 is anisotropically etched until the plurality of word lines W/L1, W/L2, W/L3, W/L1' and W/L2' are exposed thereby forming a spacer 31a at the side walls of the respective word lines. At this time, a spacer (not shown) is simultaneously formed at the side walls of the gate electrode of the MOS transistor of the peripheral circuit area. The first anti-reflective layer pattern 27a is completely removed by the anisotropic etching process that forms the spacer 31a. An impurity is selectively implanted into the peripheral circuit area of the semiconductor substrate where the spacer 31a is formed thereby forming source/drain regions (not shown) of the MOS transistor constituting the peripheral circuit. Subsequently, a second anti-reflective layer 33 is formed over the entire surface of the semiconductor substrate 21 where the source/drain regions of the peripheral circuit area are formed. The second anti-reflective layer 33 is formed of the same material layer as that of the first anti-reflective layer 27. As described above, if the second anti-reflective layer 33 is formed after forming the spacer 31a, only the second anti-reflective layer 33 having a uniform thickness can be formed on the respective word lines throughout one semiconductor substrate 21. The second anti-reflective layer 33 is a material layer for minimizing the irregular reflection of light during formation of photoresist pattern in a subsequent process.

Figure 10A:
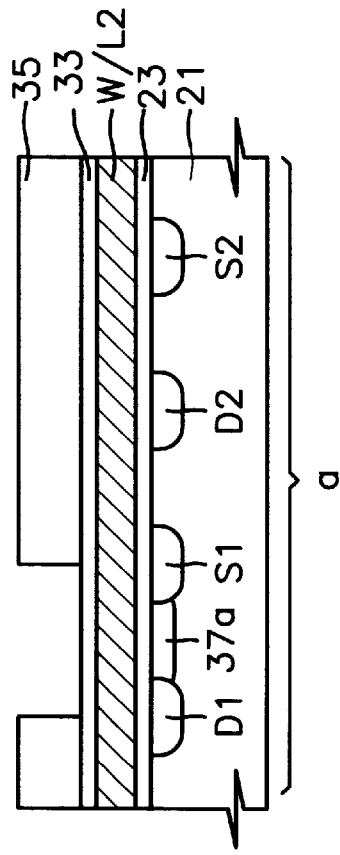
Figure 10B:
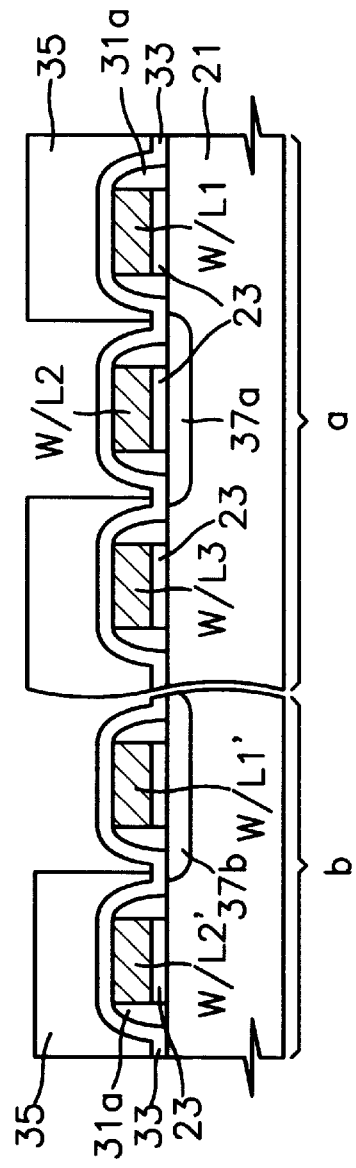

Referring to FIGS. 10A and 10B, a photoresist layer is coated over the entire surface of the semiconductor substrate where the second anti-reflective layer 33 is formed. The photoresist layer is patterned by a photolithography process. Doing so forms a photoresist pattern 35 opening a word line portion corresponding to a gate electrode of the cell transistor intended to be programmed. For example, the photoresist layer is patterned using ion implantation mask patterns M1 and M2 shown in FIG. 2. The patterned photoresist layer forms photoresist pattern 35 opening a predetermined area of the second word line W/L2 in the first region (a) and a predetermined area of the first word line W/L1' in the second region (b). An impurity is selectively implanted into the surface of the semiconductor substrate under the word lines of the opened portion, e.g., the channel region of the cell transistor intended to be programmed. Selectively implanting the impurity forms impurity layers 37a and 37b in the first and second regions a and b, respectively. At this time, the impurity is preferably of the same conductivity type as the semiconductor substrate 21, e.g., P-type. The impurity layers 37a and 37b have uniform concentration and depth even if they are spaced apart from each other in one semiconductor substrate. This is because only the second anti-reflective layer 33 having a uniform thickness exists on the respective word lines before forming the photoresist pattern 35. In other words, since only a single material layer having a uniform thickness exists over the channel regions of all cell transistors during the ion implantation process for programming, a projection range Rp of the ion implantation process is shown at a constant depth from the surface of the channel region.

As described above, according to the present invention, the level of uniformity of the depth and concentration of an impurity layer formed in channel regions of all cell transistors to be programmed can be improved throughout a single semiconductor substrate. Therefore, a mask ROM which can minimize errors generated during a reading operation can be implemented. Particularly, the present invention is effectively applied to a multi-bit cell mask ROM in which at least two different voltages are successively applied to word lines during the reading operation.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A method for fabricating a mask read only memory (ROM), comprising:

sequentially forming a gate insulation layer, a conductive layer and a first anti-reflective layer on a semiconductor substrate;

forming a plurality of word lines and a plurality of first anti-reflective layer patterns by successively patterning the first anti-reflective layer and the conductive layer;

forming an insulator layer over the entire surface of the semiconductor substrate where the plurality of word lines are formed;

anisotropically etching the insulator layer until portions of the plurality of word lines are exposed thereby forming a spacer on side walls of respective word lines;

forming a second anti-reflective layer over the entire surface of the semiconductor substrate where the spacer is formed;

forming a photoresist pattern on the second anti-reflective layer to open a portion of at least one word line corresponding to a control gate electrode of a cell transistor to be programmed; and implanting an impurity into the semiconductor substrate under the at least one word line using the photoresist pattern as an ion implantation mask.

2. The method for fabricating a mask ROM according to claim 1 wherein the gate insulation layer is a thermal oxide layer.

3. The method for fabricating a mask ROM according to claim 1 wherein the conductive layer is a polycide layer having a low resistivity.

4. The method for fabricating a mask ROM according to claim 3 wherein the polycide layer is a refractory metal.

5. The method for fabricating a mask ROM according to claim 3 wherein the polycide layer is either tungsten or titanium.

6. The method for fabricating a mask ROM according to claim 1 wherein the first and second anti-reflective layers are silicon oxynitride layers.

7. The method for fabricating a mask ROM according to claim 1 wherein the insulator layer is a CVD oxide layer.

8. The method for fabricating a mask ROM according to claim 1 wherein the implanting an impurity includes implanting an impurity having a same conductivity type as a conductivity type of the substrate.

* * * * *

UNITED STATES PATENT AND TRADEMARK OFFICE
CERTIFICATE OF CORRECTION

PATENT NO.   : 6,133,103
DATED        : October 17, 2000
INVENTOR(S)  : Lee et al.

It is certified that error appears in the above-identified patent and that said Letters Patent is hereby corrected as shown below:

Column 4,
Line 25, "illustrating a." should be -- illustrating a --.

Column 5,
Line 30, "W/L'" should be -- W/L1' --.

Signed and Sealed this

Twenty-sixth Day of November, 2002

Attest:

JAMES E. ROGAN
Attesting Officer    Director of the United States Patent and Trademark Office